United States Patent
Thompson

(10) Patent No.: US 10,034,394 B2
(45) Date of Patent: Jul. 24, 2018

(54) ELECTRICAL COMPONENT ENCLOSURE WITH A HYGIENIC HINGE

(71) Applicant: Electrix International Ltd., Bishop Auckland (GB)

(72) Inventor: Richard John Thompson, Bishop Auckland (GB)

(73) Assignee: Electrix International Ltd. (GB)

( * ) Notice: Subject to any disclaimer, the term of this patent is extended or adjusted under 35 U.S.C. 154(b) by 0 days.

(21) Appl. No.: 15/383,237

(22) Filed: Dec. 19, 2016

(65) Prior Publication Data
US 2017/0273198 A1   Sep. 21, 2017

(30) Foreign Application Priority Data

Dec. 11, 2015   (GB) .................................. 1521842.3

(51) Int. Cl.
| | | |
|---|---|---|
| *H05K 5/00* | (2006.01) | |
| *H05K 5/02* | (2006.01) | |
| *H05K 5/03* | (2006.01) | |

(52) U.S. Cl.
CPC ......... *H05K 5/0013* (2013.01); *H05K 5/0226* (2013.01); *H05K 5/03* (2013.01)

(58) Field of Classification Search
None
See application file for complete search history.

(56) References Cited

U.S. PATENT DOCUMENTS

| | | | | | |
|---|---|---|---|---|---|
| 904,898 | A | * | 11/1908 | Russell ................ | H01R 13/447 439/142 |
| 2,431,607 | A | * | 11/1947 | Christensen ............. | E05D 1/04 16/268 |
| 3,581,032 | A | * | 5/1971 | Christensen ............. | H01H 9/22 200/401 |
| 3,710,761 | A | * | 1/1973 | Gregory ............... | A01K 1/0245 119/496 |
| 4,675,782 | A | * | 6/1987 | Hibbert .................. | H02B 1/305 361/600 |
| 4,688,146 | A | * | 8/1987 | Newmark ................ | H02B 1/38 16/267 |
| 4,782,977 | A | * | 11/1988 | Watanabe ............ | B65D 55/024 220/324 |

(Continued)

FOREIGN PATENT DOCUMENTS

DE   4309044   *  9/1994  ............... H02B 1/38

*Primary Examiner* — Dimary Lopez Cruz
*Assistant Examiner* — Muhammed Azam
(74) *Attorney, Agent, or Firm* — The Belles Group, P.C.

(57) ABSTRACT

An electrical component enclosure with a hygienic hinge, which is used to house electric components, includes a body for fixing to a surface and having six faces defining a volume within which the electrical components are contained. One of the faces has an access aperture with a flange around the aperture. A closure covers the aperture to seal the body. A hinge connects the body and closure permitting movement of one to the other. The hinge includes an opening contained within the body next to the access aperture and includes a rigid extension portion which extends through the opening. The extension portion is fixed to the closure at one end and has a retaining portion at the other end which prevents the rigid extension portion from exiting the opening and allows the closure to hang from an edge of the opening.

12 Claims, 4 Drawing Sheets

(56) References Cited

U.S. PATENT DOCUMENTS

| | | | | |
|---|---|---|---|---|
| 4,886,239 A * | 12/1989 | Stimmel | | F25C 1/243 206/504 |
| 5,065,887 A * | 11/1991 | Schuh | | B65D 43/164 206/205 |
| 5,144,720 A * | 9/1992 | Aihara | | B60R 7/04 16/231 |
| 5,173,992 A * | 12/1992 | Aihara | | B60R 7/04 16/232 |
| 5,228,584 A * | 7/1993 | Williams, Jr. | | H02G 3/14 174/67 |
| 5,243,135 A * | 9/1993 | Shotey | | H02G 3/14 174/67 |
| 5,337,453 A * | 8/1994 | Bargesser | | E05D 5/12 16/380 |
| 5,441,167 A * | 8/1995 | Shigeru | | E05D 11/06 16/374 |
| 5,536,917 A * | 7/1996 | Suppelsa | | B29C 65/08 156/752 |
| 5,929,379 A * | 7/1999 | Reiner | | H02G 3/14 174/66 |
| 6,073,789 A * | 6/2000 | Lundblade | | B65D 81/3825 220/4.22 |
| 6,242,697 B1 * | 6/2001 | Gerken | | H02G 3/085 16/2.1 |
| 6,318,824 B1 * | 11/2001 | LaGrotta | | E05D 3/022 312/322 |
| 6,325,239 B2 * | 12/2001 | Randall | | B65D 1/225 220/315 |
| 6,669,041 B2 * | 12/2003 | Almond | | H02G 3/185 220/3.6 |
| 7,157,667 B2 * | 1/2007 | Gramlich | | F24C 15/008 126/190 |
| 7,360,817 B2 * | 4/2008 | Schwalie | | B60R 9/00 174/153 G |
| 7,476,806 B2 * | 1/2009 | Dinh | | H02G 3/086 174/50 |
| 7,507,912 B1 * | 3/2009 | Sempliner | | H02G 3/185 16/2.1 |
| 7,586,037 B2 * | 9/2009 | Parker | | H05K 7/18 174/17 R |
| D639,156 S * | 6/2011 | Guillemin | | D9/430 |
| D640,547 S * | 6/2011 | Guillemin | | D9/417 |
| D645,339 S * | 9/2011 | Oakes | | D9/420 |
| D645,737 S * | 9/2011 | Oakes | | D9/420 |
| D661,815 S * | 6/2012 | Tobbe | | D25/60 |
| 8,198,553 B2 * | 6/2012 | Durst | | G01G 21/286 174/520 |
| 8,245,875 B2 * | 8/2012 | Everson | | B65D 43/162 220/213 |
| 8,371,468 B2 * | 2/2013 | Sellari | | B65D 43/162 206/807 |
| 8,381,946 B2 * | 2/2013 | Everson | | B65D 43/162 220/803 |
| 8,511,509 B2 * | 8/2013 | Merritt | | B01L 1/50 16/345 |
| 8,530,757 B2 * | 9/2013 | Dinh | | H02G 3/088 174/481 |
| 8,657,138 B2 * | 2/2014 | Everson | | B65D 43/162 220/23.89 |
| 8,710,368 B2 * | 4/2014 | Phillips | | H02G 3/08 174/50 |
| 9,016,270 B2 * | 4/2015 | Chezem | | F24C 15/04 126/190 |
| 9,132,942 B2 * | 9/2015 | Nikaein | | B65D 43/0249 |
| 2002/0153373 A1 * | 10/2002 | Traut | | H02G 3/081 220/3.8 |
| 2006/0151354 A1 * | 7/2006 | Dombroski | | B65D 81/2053 206/524.8 |
| 2007/0227939 A1 * | 10/2007 | Chen | | G06F 1/182 206/701 |
| 2009/0303666 A1 * | 12/2009 | Brizes | | H02B 1/46 361/658 |
| 2012/0200211 A1 * | 8/2012 | Yanni | | A47B 67/00 312/242 |
| 2014/0354126 A1 * | 12/2014 | DeLorean | | A47B 51/00 312/236 |
| 2014/0362500 A1 * | 12/2014 | Tsuchida | | H05K 5/0013 361/679.01 |
| 2015/0027774 A1 * | 1/2015 | Kang | | H02B 1/28 174/535 |
| 2017/0273198 A1 * | 9/2017 | Thompson | | H05K 5/0013 |

* cited by examiner

ELECTRICAL COMPONENT ENCLOSURE WITH A HYGIENIC HINGE

CROSS-REFERENCE TO RELATED APPLICATIONS

This application claims priority under 35 U.S.C. § 119 of GB Application No. 1521842.3, filed Dec. 11, 2015. The disclosure of the above application is incorporated herein by reference.

FIELD OF INVENTION

The present invention relates to an electrical component enclosure and relates particularly, but not exclusively, to enclosures used in clean production or manufacture environments.

BACKGROUND

The use of enclosures to house and protect electrical components is well known. Such enclosures are commonly used in industries where cleanliness is important, such as food and beverage production and preparation and pharmaceutical manufacture. In these environments it is important that the enclosures are easy to clean but must also be sealed to prevent water ingress.

A common form of such enclosures includes a switch or other component which extends through one of the faces of the enclosure. This is typically the front plate which is removable to allow access to the enclosure and the wiring and components inside.

During installation and maintenance the front or closure plate of the enclosure is removed in order to allow access to the enclosure. If a component, such as a switch, extends through the closure face the wires connected to the switch will limit the extent to which the closure face can move. It is therefore commonplace for the closure plate to be left hanging by the wires connecting to the switch which is inadvisable because the weight of the closure plate and the switch pulls on the connection between the wire and the switch. This can lead to damage to the wires and to loose or poor connections.

It is known to attempt to overcome this problem by connecting the closure plate to the enclosure using a hinge. However, such hinged attachments, for example using a piano hinge, lead to an increase in the number of small spaces on the outside surface where dirt can collect, particularly around the hinge. Furthermore, these hinges cannot be used where the closure plate has flanges which extend slightly around the edge of the enclosure body. It is also the case that to add such a hinge to an enclosure requires a complete redesign of the enclosure and these hinges can interfere with the operation of the seal.

BRIEF SUMMARY

According to an aspect of the present invention there is provided an electrical component enclosure for containing electrical components, the enclosure comprising: a body for fixing adjacent a surface and for receiving electrical components therein, the body having faces defining a volume within which the electrical components are contained, at least one face having an access aperture formed therein and at least one flange extending at least partially around said access aperture; a closure for closing said access aperture and substantially sealing said body; and a hinge connecting said body and said closure and for permitting the movement of said closure relative to said body, the hinge including an opening contained within said body adjacent said access aperture and also including a rigid extension portion extending through said opening, the extension portion being fixed to said closure at one end and having a retaining portion at the other end for preventing the rigid extension portion exiting the opening when it is moving substantially perpendicular to the face containing the access aperture and for allowing the closure to hang from an edge of said opening.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

Preferred embodiments of the present invention will now be described, by way of example only, and not in any limitative sense with reference to the accompanying drawings in which.

DETAILED DESCRIPTION

Figure 1:
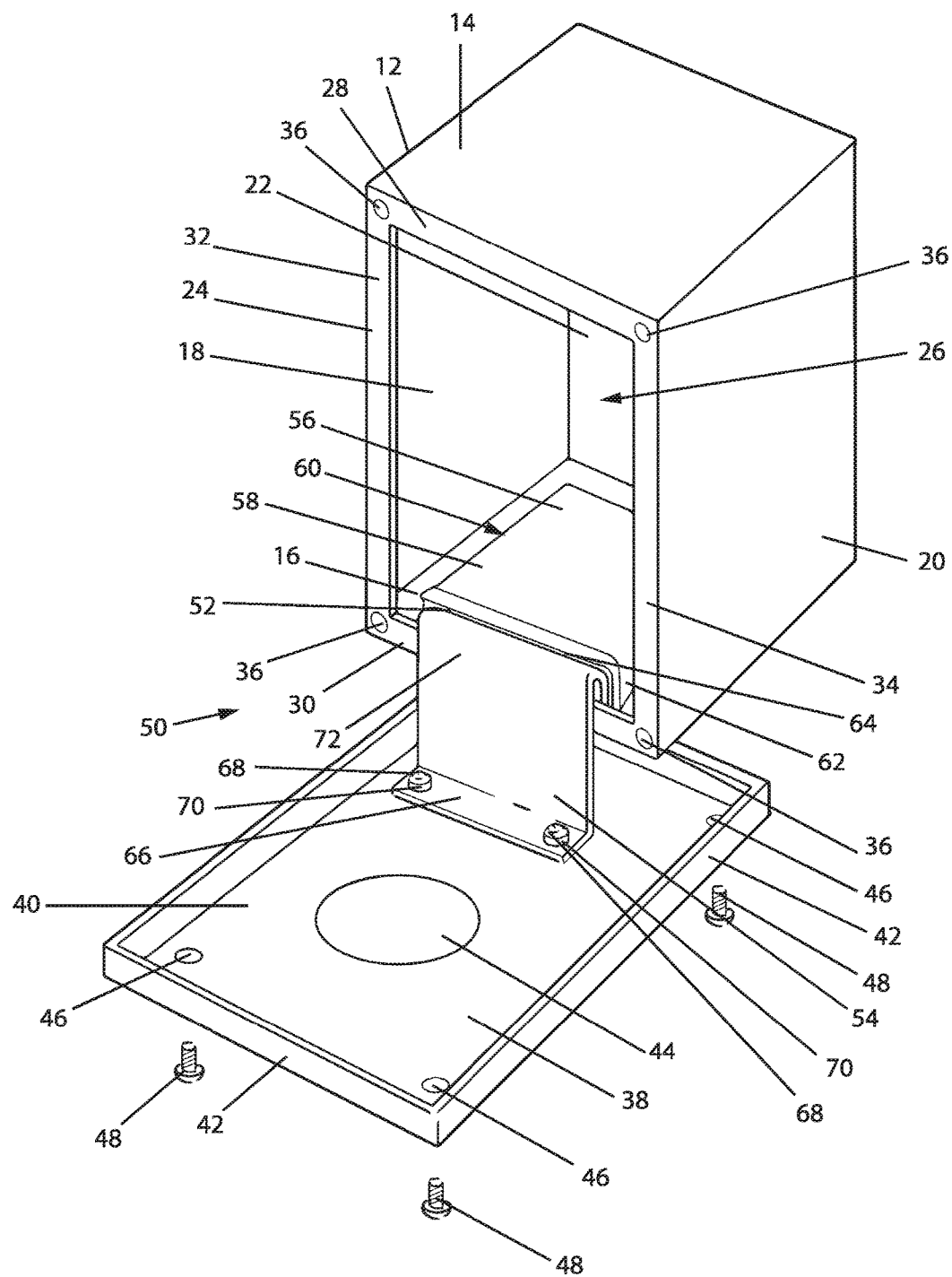
FIG. 1 is a perspective view of an enclosure of the present invention.

The following description of the preferred embodiment(s) is merely exemplary in nature and is in no way intended to limit the invention, its application, or uses.

As used throughout, ranges are used as shorthand for describing each and every value that is within the range. Any value within the range can be selected as the terminus of the range. In addition, all references cited herein are hereby incorporated by referenced in their entireties. In the event of a conflict in a definition in the present disclosure and that of a cited reference, the present disclosure controls.

Preferred embodiments of the present invention seek to overcome or alleviate the above described disadvantages of the prior art.

By providing a hinge of the type described above on an enclosure the advantage is provided that the wires, and in particular the connection of the wires to a component formed in the closure, are protected from excess strain being applied to them. Furthermore, the hinge described above can be added to an existing product range by the addition of components without needing to redesign the enclosure. As a result, the same enclosure can be offered with and without the hinge. Furthermore, the hinge described above is, when the enclosure is closed, contained entirely within the enclosure and therefore does not alter the external surfaces or increase the number of locations where dirt can accumulate. The hinge is therefore offering advantages over the prior art without creating a product with disadvantages.

In a preferred embodiment the rigid extension portion comprises a sheet material.

By forming the rigid extension portion from a sheet material, and in particular a metallic sheet material, the advantage is provided that a robust component can be easily added to the enclosure to provide a hinge of the type described above.

In another preferred embodiment said sheet material comprises a bent portion adjacent one end, said bent portion being attached to said closure.

The retaining portion may be formed in one edge of said extension portion which is cut to form edge portions with at least one edge portion bent.

By cutting an edge of the sheet material to form the retaining portions the advantage is provided that the retaining portion can be formed by simply cutting the sheet material at one edge and bending at least one of the cut portions. This is a very low cost way of producing a rigid extension portion which provides all the advantages of the present invention.

In a preferred embodiment at least one edge portion is bent to form a hook for engaging an edge of said opening.

If one of the edge portions is bent to form a hook this allows the closure to be securely supported on an edge of the opening.

In another preferred embodiment the opening is formed in said flange.

The enclosure may further comprise a protection portion located in the bottom of the body, adjacent said flange such that an edge of the protection portion and an edge of the flange form said opening and that said rigid extension portion slides into a space between said protection portion and said bottom of said body.

By providing a protection portion located in the bottom of the body the advantages provided that any cables or other components within the enclosure are protected from coming into contact with the rigid extension portion. In particular, the protection portion creates a slot which requires the rigid extension portion, and the closure plate, to move away from the enclosure in a direction that is perpendicular to the face which includes the access aperture this ensures that the rigid extension portion is kept away from the components within the enclosure.

In a preferred embodiment the body is substantially cuboid.

In another preferred embodiment at least one face is not perpendicular to at least one side adjacent to it.

In a further preferred embodiment at least one face extends beyond the edge of another face thereby forming an overhang.

The flange may extend around all of said access apertures.

The flange may also have retaining apertures formed therein for receiving retaining devices.

Referring to the figures, and in particular FIG. 1, an electrical component enclosure is provided for containing electrical components. The enclosure 10 includes a body 12 for fixing adjacent a surface (not shown) such as a wall. Typically enclosures of the type described herein are attached to wall surfaces by the use of fixing screws. However, this enclosure is suitable for use in other locations.

The body 12 is formed from a plurality of walls or faces including top and bottom walls 14 and 16, sidewalls 18 and 20 and a rear wall 22, through which the previously referred to fixing screws would typically extend. In addition to these five walls a front wall 24 is also provided in the body 12 which therefore forms a cuboid. The front wall 24 is provided with an access aperture 26 which allows access into the volume defined by the walls of the body 12. This access aperture 26 covers the majority of the front wall 24 and this wall therefore appears in the form of four flanges 28, 30, 32 and 34 extending from the top wall 14, bottom wall 16 and sidewalls 18 and 20 respectively. Formed in the junctions of these flange is, in other words adjacent the corners of the front wall 24, are retaining apertures in the form of threaded holes 36.

The enclosure 10 also includes a closure, in the form of closure plate 38 which is used to close the access aperture 26 and substantially seal the body 12. This sealing is typically achieved by the inclusion of a neoprene or rubber seal which extends around the closure plate 38 adjacent its outer edge. The closure plate 38 has a substantially planar front plate 40 which is sized to cover the whole of the front face 24 of body 12 and has a lip 42 extending perpendicular to the front plate 40. When the cover plate 38 is in place on the body 12 the lip 42 extends slightly over the top, bottom and side walls 14, 16, 18 and 20. Typically, although not essentially, the cover plate 38 is provided with a component aperture 44 through which an electrical component, such as a switch, can be provided. Also extending through the front plate 40 are for fixing apertures 46 which are aligned with the threaded holes 36 and through which fixing bolts 48 can extend to fix the closure plate 38 to the body 12. The components described so far are all known for enclosures of the prior art.

Also forming part of the enclosure 10 is a hinge 50 which connects the body 12 and the closure plate 38. The two main features of the hinge 50 are an opening 52 and a rigid extension portion 54. The opening 52 is contained within the body 12 adjacent to the access aperture 26 and specifically close to the flange 30 extending from the bottom wall 16. The opening 52 is formed in part by a further component, that being a protection portion, in the form of bridge 56, which is located in and fixed to the inside of the bottom wall 16 of the body 12. The bridge 56 is formed from a sheet of metallic material which is bent to have a top portion 58 with legs 60 and 62 extending substantially perpendicularly down from the top portion 58. The legs 60 and 62 are fixed to the inner surface of bottom wall 16 and this is typically achieved by welding. This fixing may be assisted by the provision of feet (not shown) which extend from the legs 60 and 62 approximately parallel to the top portion 58 so as to increase the surface area of contact between the bridge 56 and the wall 16. The front edge 64 of the bridge 56 is located very close to the flange 30 of the body 12 and the opening 52 is formed from a combination of that front edge 64 (in particular from the top portion 58 and legs 60 and 62) and the upper edge of flange 30. This combination of edges forms a substantially rectangular opening through which the rigid extension portion 54 extends.

Figure 3:
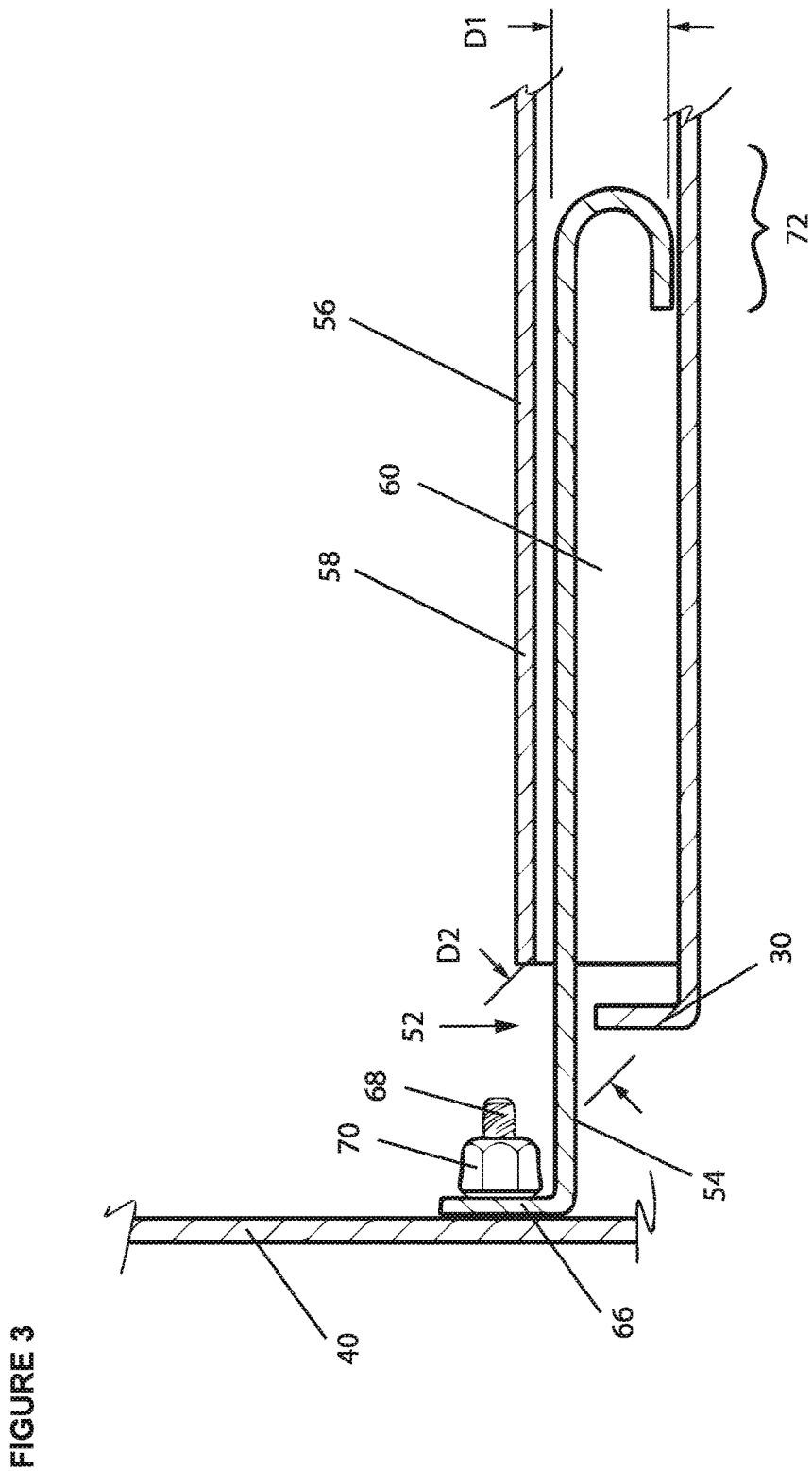
FIG. 3 is a sectional view of a portion of the enclosure of either FIG. 1 or 2.

The rigid extension portion itself is also formed from a sheet of metallic material which has been bent. The extension portion 54 can be divided into three parts. Firstly, at one end of the extension portion 54 a fixing portion 66 is used to fix this component to the closure plate 38. In the example shown in FIG. 1 threaded studs are welded to the inner surface of the front plate 40 and apertures in the fixing portion 66 allow the threaded studs 68 to extend their through and then nuts 70 to fix the extension portion 54 to the closure plate 38. At the other end of the extension portion there is provided a retaining portion 72 which is provided to prevent the extension portion 54 from being removed from the opening 52. Referring to FIG. 3, the retaining portion 72 is formed by bending the sheet metal to form a U shape. The distance D1, across the ends of the U shape in the retaining portion, is greater than the height D2 of the opening 52.

Operation of the enclosure 10 will now be described. The following description is provided from the point of view of the enclosure 10 being installed on a wall surface and an operator opening the enclosure, for example to undertake maintenance all complete installation of electrical components contained therein. The closure plate 38 is fixed to the body 12 by the fixing bolts 48. To remove the closure plate 38 the fixing bolts 48 are loosened so that they are free from the threaded fixing apertures 46. The closure plate 38 is then moved in a direction that is substantially perpendicular to the front plate 40 or parallel to the top portion 58 of bridge 56 and bottom wall 16 of body 12. The initial movement of the closure plate 38 cannot substantially deviate from this direction since the top portion 58 of bridge 56 and the bottom wall 16 of body 12 prevent the rigid extension portion 54 from pivoting around the edges of the opening 52. As the closure plate 38 moves further away from the body 12 the retaining portion 72 eventually engages the flange 30 and prevents any further movement from continuing in the same direction. However, once the retaining portion 72 engages the flange 30 the closure plate 38 and extension portion 54 are able to pivot downwards and can hang with the retaining portion 72 hooked over the flange 30. This therefore supports the closure plate 38 and as long as the wires to a component in component aperture 44 are long enough no weight will be born on these wires.

In this embodiment if complete removal and separation of the closure plate 38 from the body 12 is required the closure plate 38 and extension portion 54 can be moved in an upwards direction which are hooks of the retaining portion 72 from the flange 30 freeing these components.

Figure 4:
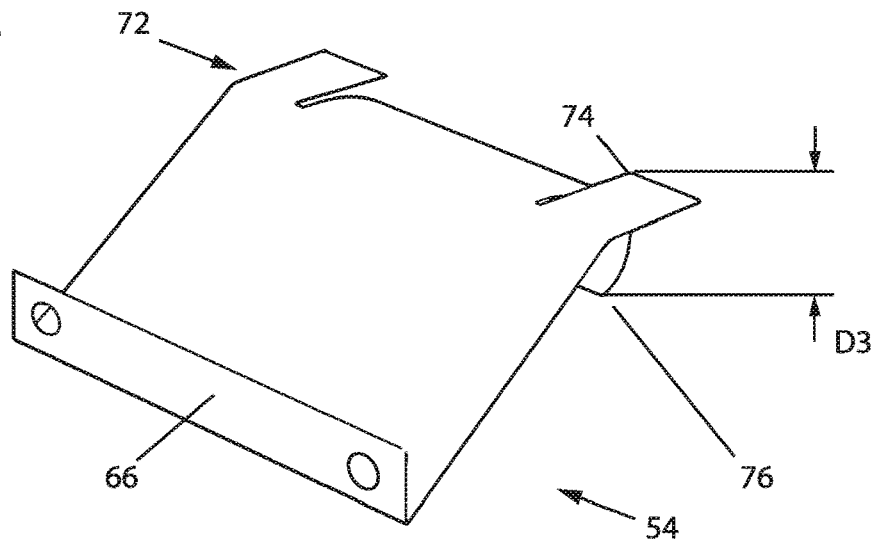
FIGS. 4 and 5 are perspective views of different embodiments of components of the present invention.
Figure 5:
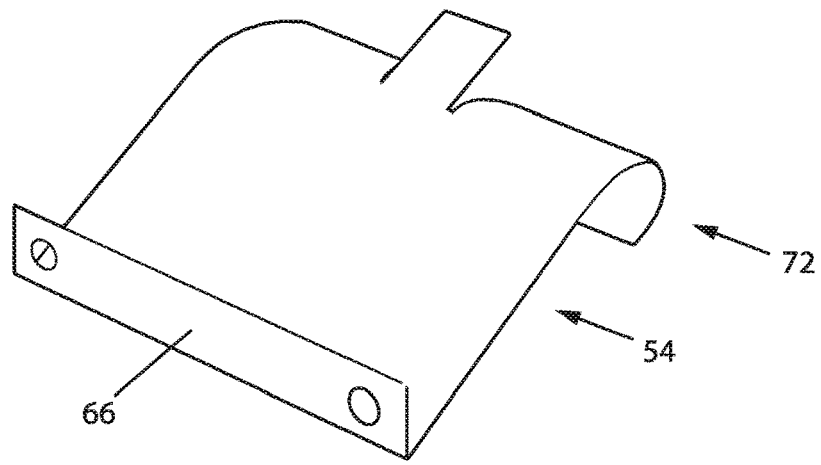
Figure 6:
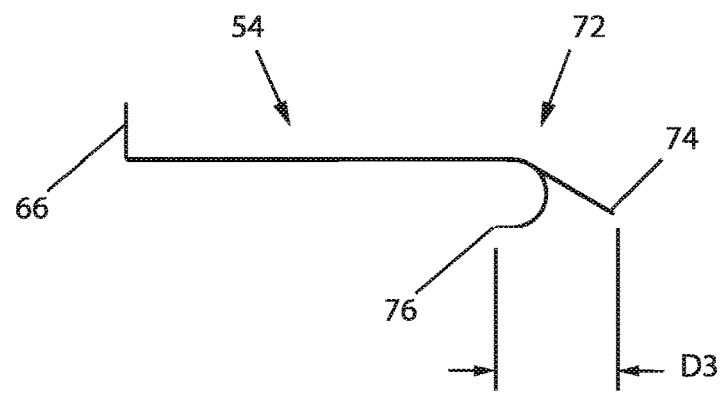
FIG. 6 is a side view of one of the components of FIGS. 4 and 5.

An alternative version of the extension portion 54 is shown in FIGS. 4 to 6. In these examples a pair of cuts has been made in the extension portion 54 before the bend that forms the retaining portion 72 has been made. As a result, three tabs are formed and at least one tab is bent or the tabs are bent by differing amounts to form the retaining portion 72. These differently bent tabs prevent the retaining portion 72 from being removed through the opening 52. This is because not only is the distance D1 greater than the distance D2 but also the distance D3, this being the distance between adjacent tips 74 and 76 of adjacent tabs formed in the retaining portion 72 are also greater than the distance D2. As a result, the enclosure 10 must be constructed with the bridge 56 being joined to the body 12 with the extension portion 54 located between the bridge 56 and bottom wall 16.

Figure 2:
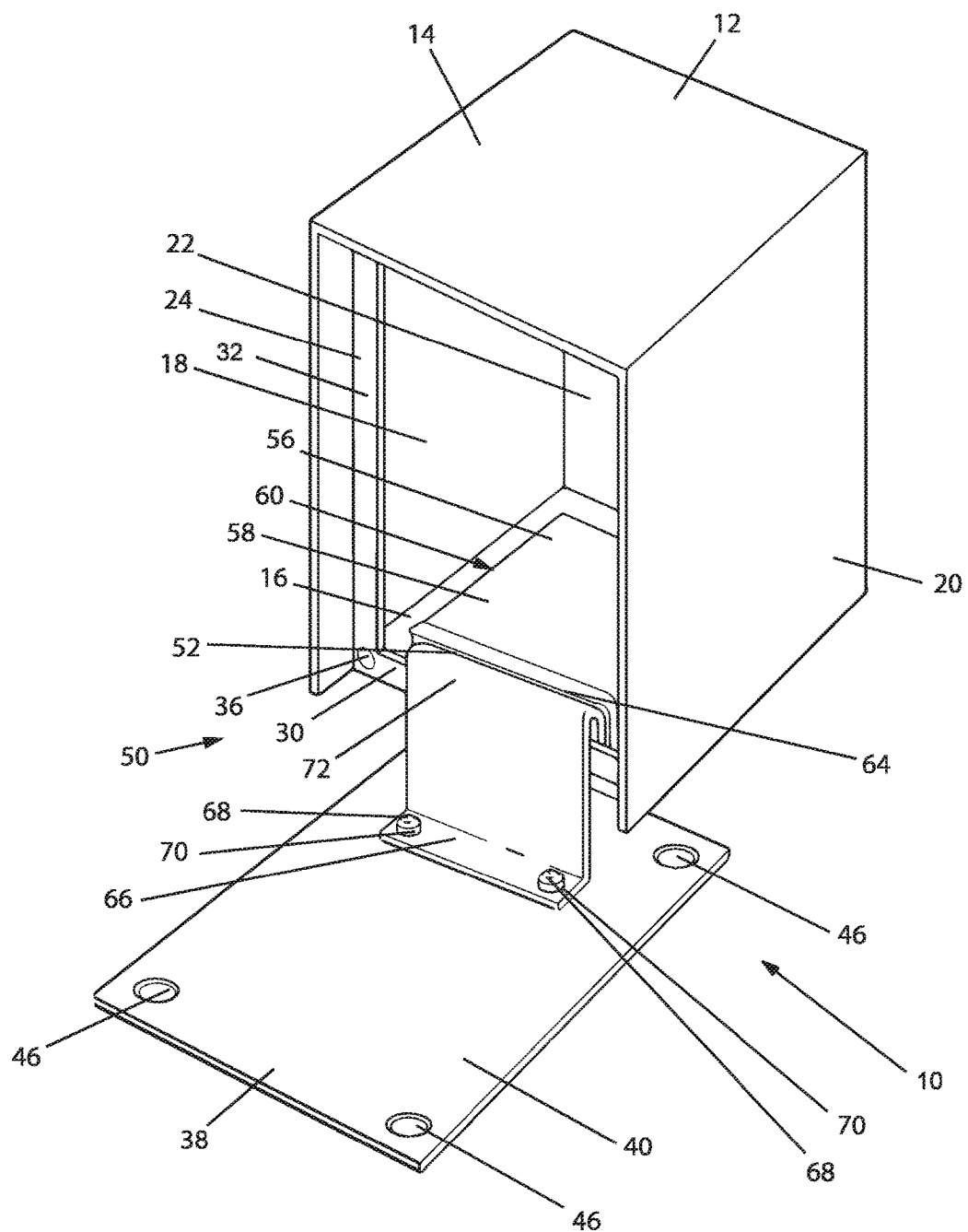
FIG. 2 is a perspective view of an alternative enclosure of the present invention.

Referring to FIG. 2, an alternative enclosure 10 is shown in this drawing this enclosure differs from that described above only in that the top wall 14 and the sidewalls 18 and 20 extend beyond the front wall 24 to form an overhang. As a result, the closure plate 38 cannot include the lip 42 and therefore comprises the front plate 40 without the perpendicular lip extending therefrom. The hinge 50 remains the same in this embodiment as that previously described.

It will be appreciated by persons skilled in the art that the above embodiments have been described by way of example only and not in any limitative sense, and that various alterations and modifications are possible without departure from the scope of the protection which is defined by the appended claims. For example, the opening 52 can be formed by other means. One such example is to make the bottommost portion of the flange, indicated at 30, much larger and forming the opening as an aperture in that larger flange. Such an aperture can operate with or without bridge 56. The inclusion of the bridge 56 has the advantage that any cables or components within the enclosure are protected from the movement of the rigid extension portion 54 and it ensures that the front plate 40 moves horizontally outwards when initially being removed from the body 12.

A further example of a variation is that the front plate 40 can be fixed to the body 12 by any suitable fixing means. One such suitable method would be to replace the fixing bolts 48 with turnbuckles which act on the flange is 28, 30, 32 and 34. Furthermore, the component aperture may not be present, as shown in FIG. 2, if the enclosure is simply designed to contain components with an external switching mechanism being present. The use of the hinge described above in this situation has the advantage that the front plate 40 remains attached to the enclosure preventing it from being lost or being dropped and potentially causing injury when working at height.

What is claimed is:

1. An electrical component enclosure for containing electrical components, the enclosure comprising:
   a body for fixing adjacent a surface and for receiving electrical components therein, the body having faces defining a volume within which the electrical components are contained, at least one of said faces having an access aperture formed therein and at least one flange extending at least partially around said access aperture;
   a closure for closing said access aperture and substantially sealing said body; and
   a hinge connecting said body and said closure and for permitting the movement of said closure relative to said body, the hinge including an opening contained within said body adjacent said access aperture and also including a rigid extension portion extending through said opening, the extension portion being fixed to said closure at one end and having a retaining portion at the other end for preventing the rigid extension portion exiting the opening when it is moving substantially perpendicular to the at least one of said faces containing the access aperture and for allowing the closure to hang from an edge of said opening.

2. The enclosure according to claim 1 wherein said rigid extension portion comprises a sheet material.

3. The enclosure according to claim 2, wherein said sheet material is bent adjacent one end, said one end being attached to said closure.

4. The enclosure according to claim 1, wherein said retaining portion is formed in one edge of said extension portion which is cut to form edge portions with at least one edge portion bent.

5. The enclosure according to claim 1, wherein at least one edge portion is bent to form a hook for engaging an edge of said opening.

6. The enclosure according to claim 1, wherein said opening formed in said flange.

7. The enclosure according to claim 1, the enclosure further comprising a protection portion located in a bottom of the body, adjacent said flange such that an edge of the protection portion and an edge of the flange form said opening and that said rigid extension portion slides into a space between said protection portion and said bottom of said body.

8. The enclosure according to claim 1, wherein said body is substantially cuboid.

9. The enclosure according to claim 1, wherein at least one of said faces is not perpendicular to at least one other of said faces adjacent to it.

10. The enclosure according to claim 1, wherein at least one of said faces extends beyond the edge of another of said faces thereby forming an overhang.

11. The enclosure according to claim 1, wherein said flange extends around all of said access aperture.

12. The enclosure according to claim 1, wherein said flange has retaining apertures formed therein for receiving retaining devices.

* * * * *